United States Patent
Kawaguchi et al.

(10) Patent No.: US 9,184,747 B2
(45) Date of Patent: Nov. 10, 2015

(54) MEMBER FOR ELECTROSTATIC CAPACITANCE-TYPE SENSOR AND ELECTROSTATIC CAPACITANCE-TYPE SENSOR USING THE SAME

(75) Inventors: Toshiyuki Kawaguchi, Saitama (JP); Hiroto Komatsu, Saitama (JP)

(73) Assignee: SHIN-ETSU POLYMER CO., LTD. (JP)

( * ) Notice: Subject to any disclaimer, the term of this patent is extended or adjusted under 35 U.S.C. 154(b) by 199 days.

(21) Appl. No.: 13/819,921

(22) PCT Filed: Aug. 30, 2011

(86) PCT No.: PCT/JP2011/069637
§ 371 (c)(1),
(2), (4) Date: Feb. 28, 2013

(87) PCT Pub. No.: WO2012/029801
PCT Pub. Date: Mar. 28, 2012

(65) Prior Publication Data
US 2013/0153392 A1 Jun. 20, 2013

(30) Foreign Application Priority Data
Sep. 1, 2010 (JP) .................................. 2010-195980

(51) Int. Cl.
*H03K 17/975* (2006.01)
*H03K 17/96* (2006.01)

(52) U.S. Cl.
CPC .. *H03K 17/962* (2013.01); *H03K 2217/960755* (2013.01)

(58) Field of Classification Search
CPC ............. H01G 5/00; H01G 7/00; H01G 5/01; H01G 7/06; H01G 5/16; H01G 4/228; H01G 4/06; H02B 1/00; H05K 5/00; H05K 7/00; C22C 1/0466; C22C 5/06; G06F 1/16; G06F 3/044; G06F 2203/04103; H01H 2001/022; H01H 2209/00; H01H 2223/00; H01H 2231/016; H01H 2239/056; H01H 9/00; H01H 13/70; H01H 13/86; H01H 2209/002; H01H 2209/021; H01H 2209/026
USPC .................. 200/511, 512, 600, 292; 345/173; 361/271, 277, 278, 280, 281, 283.1, 361/283.3, 290, 309, 321.1, 321.3, 600, 361/679.01, 679.3, 679.4, 541
See application file for complete search history.

(56) References Cited

U.S. PATENT DOCUMENTS

| | | | |
|---|---|---|---|
| 7,148,439 B2 * | 12/2006 | Nashiki et al. | 200/512 |
| 7,671,289 B2 * | 3/2010 | Matsukawa et al. | 200/313 |
| 2009/0181262 A1 * | 7/2009 | Isaksson et al. | 428/626 |

FOREIGN PATENT DOCUMENTS

| | | |
|---|---|---|
| JP | 2008-269950 | 11/2008 |
| JP | 2009-238661 | 10/2009 |
| JP | 4456508 | 4/2010 |

OTHER PUBLICATIONS

International Search Report and Written Opinion mailed Oct. 18, 2011 in corresponding PCT International Application No. PCT/JP2011/069637.

*Primary Examiner* — Edwin A. Leon
*Assistant Examiner* — Anthony R. Jimenez
(74) *Attorney, Agent, or Firm* — Ostrolenk Faber LLP

(57) ABSTRACT

A member for an electrostatic capacitance-type sensor which suppresses a decrease in the variation amount of the electrostatic capacitance caused between an input body and the electrode through a proximate operation or a touch operation by the input body and has a metallic luster appearance which does not degrade with time, and is economical, and an electrostatic capacitance-type sensor using the same. The disclosed member includes a sheet member having an operation surface S on which a proximate operation or a touch operation by an input body is carried out and an electrode which is disposed on the opposite side of the operation surface of the sheet member, in which the sheet member includes a decorative layer having a metallic luster, and the decorative layer is a continuous film made of silicon or an alloy of silicon and a metal.

9 Claims, 2 Drawing Sheets

MEMBER FOR ELECTROSTATIC CAPACITANCE-TYPE SENSOR AND ELECTROSTATIC CAPACITANCE-TYPE SENSOR USING THE SAME

CROSS-REFERENCE TO RELATED APPLICATIONS

The present application is a 35 U.S.C. §§371 national phase conversion of PCT/JP2011/069637, filed Aug. 30, 2011, which claims priority of Japanese Patent Application No. 2010-195980, filed Sep. 1, 2010, the contents of which are incorporated herein by reference. The PCT International Application was published in the Japanese language.

TECHNICAL FIELD

The present invention relates to a member for an electrostatic capacitance-type sensor which can cause a variation in electrostatic capacitance between an input body, such as a finger, and an electrode through a proximate operation or a touch operation by the input body, and to an electrostatic capacitance-type sensor which detects a proximate operation or a touch operation by an input body, such as a finger.

BACKGROUND ART

Input apparatuses which detect a proximate operation or a touch operation (including a slide operation) by an input body, such as a user's finger, with a sensor and input the operation-based information to an electronic device and the like (for example, a transparent touch panel provided on the front surface of a display panel such as a liquid crystal display panel or the like, and an operation panel in which buttons, switches, keys, pads and the like for operating a variety of apparatuses such as home appliances, mobile phones, personal computers, automobiles and the like are disposed) are known.

As a sensor that detects a proximate operation or a touch operation by an input body, an electrostatic capacitance-type sensor which has a substrate, an electrode provided on the surface of the substrate, a protective layer that protects the electrode, and an external control unit that is connected to the electrode, and detects a variation in the electrostatic capacitance generated between the input body and the electrode, which is caused by a proximate operation or a touch operation by an input body made of a conductor (a user's finger, a movable electrode or the like), with the control unit is known (PTL 1).

Meanwhile, in an ordinary operation panel in which mechanical buttons, switches and the like are disposed, there is a case in which a decorative layer, which is visible from the surface, is provided in order to provide design properties. Examples of the decorative layer include a metal plate and the like.

However, in an operation panel having an electrostatic capacitance-type sensor, in a case in which a decorative layer made of a metal plate is provided in the electrostatic capacitance-type sensor, due to the conductivity of the decorative layer, the variation amount of the electrostatic capacitance between an input body and the electrode decreases, and the detection accuracy of a proximate operation or a touch operation degrades.

Therefore, it is proposed to configure the decorative layer using a fine metal, such as indium, tin or aluminum, in a discontinuous island structure (PTL 2). Since the conductivity of the decorative layer is decreased by configuring the decorative layer in a discontinuous island structure, a decrease in the variation amount of the electrostatic capacitance caused between an input body and the electrode through a proximate operation or a touch operation by the input body is suppressed.

However, in a decorative layer configured in a discontinuous island structure, due to abrasion, compressive stress and the like caused by handling in a manufacturing process, some islands are connected to each other, and form a network which serves as a favorable conductor such that the conductivity is liable to increase. Therefore, it is necessary to confirm the bridging action of all islands, which requires efforts. In addition, tin or aluminum is liable to become an oxide or a chloride, and loses the metal luster over time. Meanwhile, indium is not stably supplied and is expensive.

CITATION LIST

Patent Literature

[PTL 1] Japanese Patent No. 4456508
[PTL 2] Japanese Unexamined Patent Application, First Publication No. 2008-269950

SUMMARY OF INVENTION

Technical Problem

The invention provides a member for an electrostatic capacitance-type sensor which suppresses a decrease in the variation amount of the electrostatic capacitance caused between an input body and the electrode through a proximate operation or a touch operation by the input body and has a metallic luster appearance which does not degrade with time, and which is low cost and favorably productive; and an electrostatic capacitance-type sensor in which a decrease in detection accuracy of a proximate operation or a touch operation by the input body is suppressed and which has a metallic luster appearance which does not degrade with time.

Solution to Problem

The member for an electrostatic capacitance-type sensor of the invention is a member for an electrostatic capacitance sensor including a sheet member having an operation surface on which a proximate operation or a touch operation by an input body is carried out and an electrode which pinches the sheet member and is disposed on the opposite side of the operation surface, in which the sheet member includes a decorative layer having a metallic luster, and the decorative layer is a continuous film made of silicon or an alloy of silicon and a metal.

The sheet member preferably further includes a protective layer provided on the surface of the decorative layer.

The sheet member preferably further includes a reflection layer provided on the electrode side of the decorative layer.

The sheet member and the electrode are preferably in contact with each other.

The electrostatic capacitance sensor of the invention includes the member for an electrostatic capacitance sensor of the invention and a control unit that detects a variation in the electrostatic capacitance between the input body and the electrode when a proximate operation or a touch operation by the input body is carried out on the operation surface.

Advantageous Effects of Invention

The member for an electrostatic capacitance-type sensor of the invention suppresses a decrease in the variation amount of the electrostatic capacitance caused between an input body and the electrode of a proximate operation or a touch operation by the input body and has a metallic luster appearance which does not degrade with time, and which is low cost and has excellent productivity.

In the electrostatic capacitance-type sensor of the invention, a decrease in detection accuracy of a proximate operation or a touch operation by the input body is suppressed, and the electrostatic capacitance-type sensor of the invention has a metallic luster appearance which does not degrade with time.

DESCRIPTION OF EMBODIMENTS

Member for an Electrostatic Capacitance-Type Sensor

Figure 1:
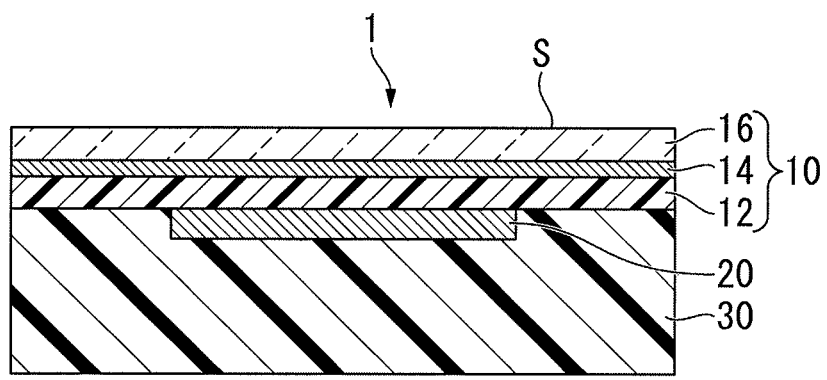
FIG. 1 is a cross-sectional view illustrating an example of the member for an electrostatic capacitance-type sensor of the invention.

FIG. 1 is a cross-sectional view illustrating an example of the member for an electrostatic capacitance-type sensor of the invention. The member for an electrostatic capacitance-type sensor 1 is a sheet-shaped or plate-shaped member including a sheet member 10 having an operation surface S on which a proximate operation or a touch operation by an input body (not shown) is carried out, wire lines (not shown) for connecting an electrode 20 formed on the surface on the opposite side of the operation surface S of the sheet member 10 and the electrode 20 to an external control unit (not shown), and a substrate 30 attached to the surface on the opposite side of the operation surface S of the sheet member 10 and the electrode 20 using an adhesive (not shown).

(Sheet Member)

The sheet member 10 is a laminate sheet in which an insulting layer 12, a decorative layer 14 and a protective layer 16 are sequentially laminated on the substrate 30 over the electrode 20, and the outermost surface of the protective layer 16 forms the operation surface S.

(Insulating Layer)

The insulating layer 12 is a layer made of an insulting and flexible thin film.

Examples of a material for the insulating layer 12 include polyolefins (polyethylene, polypropylene, ethylene-propylene copolymer, ethylene-vinyl acetate copolymer, and the like), cyclic polyolefins, denatured polyolefins, polyvinyl chloride, polyvinylidene chloride, polystyrene, polycarbonates, poly-(4-methylpentene-1), ionomers, acryl-based resins (polymethyl methacrylate and the like), acrylonitrile-butadiene-styrene copolymers (ABS resins), acrylonitrile-styrene copolymers (AS resins), butadiene-styrene copolymers, polyesters (polyethylene terephthalate, polybutylene terephthalate, polycyclohexane terephthalate, and the like), polyphenylene oxides, denatured polyphenylene oxide, polysulfone, polyether sulfone, polyvinylidene fluorides, unsaturated polyesters, silicone-based resins, urethane-based resins, and the like.

The materials of the insulating layer 12 may be used singly or may be used in combinations of two or more kinds thereof so as to form a copolymer, a polymer blend, a polymer alloy, or the like.

As the material of the insulating layer 12, polycarbonates, polymethyl methacrylate, AS resins, polystyrene, cyclic polyolefins, polyethylene terephthalate, polybutylene terephthalate, denatures thereof, copolymers thereof, and the like are preferable in terms of transparency, strength and humidity permeability.

The thickness of the insulating layer 12 is preferably 10 μm to 200 μm, and more preferably 10 μm to 50 μm in terms of the detection accuracy of a proximate operation or a touch operation.

(Decorative Layer)

The decorative layer 14 is a continuous film (homogenous film) made of silicon or an alloy of silicon and a metal, and is different from the discontinuous island-like structure made of indium or the like of the related art. In addition, unlike the discontinuous island-like structure of the related art, the decorative layer 14 has a small surface area and is made of a material having high corrosion resistance, and therefore chemical deterioration is suppressed.

Silicon is a semiconductor substance unlike metals described below. Silicon has the following characteristics and is preferable compared to other semiconductor substances.

(i) Silicon has high reflectance and is shiny compared to other semiconductor substances.

(ii) The proportion of metal in an alloy can be increased, since the silicon has low electroconductivity. As a result, the alloy is shiny, and the internal stress thereof can be reduced.

(iii) Silicon is easily procured, and the like.

Silicon may include impurities, which do not serve as dopants, as long as the surface resistivity of the decorative layer 14 can be maintained at a high level.

Silicon preferably includes as few dopants (boron, phosphorous, arsenic, antimony and the like) as possible. The amount of the dopants is preferably 1 ppm or less, and more preferably 10 ppb or less.

As a material for the decorative layer 14, an alloy of silicon and a metal is preferable for the following reasons.

(i) The reflectance and shininess thereof are higher than those of silicon alone, and a shiny decorative layer 14 can be obtained.

(ii) Since the alloy is soft compared to silicon alone, the internal stress of the decorative layer 14 is decreased, the adhesion with the insulating layer 12 improves, and the occurrence of cracking is suppressed.

The metal preferably has a reflectance of 50% or more. In addition, the reflectance is preferably 99.5% or less, more preferably 60% to 99.5%, and still more preferably 70% to 99.5%. Examples of the metal include gold, silver, copper, aluminum, platinum, iron, nickel, chromium, and the like. In terms of reflectance and costs, aluminum and silver are preferable, and aluminum is more preferable.

The reflectance is the diffuse reflectance including the regular reflectance, which is based on the condition d(n-D) in JIS Z8722, is an average value in a visible light range reaching 360 nm to 400 nm on the short wavelength side and 760 nm to 830 nm on the long wavelength side, and is measured using an integration sphere, including the regular reflectance which is a luster component.

The proportion of the metal is preferably, in the alloy (100 volume %), 0.1 volume % to 70 volume %, and more preferably 40 volume % to 70 volume %. When the proportion of the metal is 0.1 volume % or more, the shininess of the decorative layer 14 is improved, and the internal stress of the decorative layer 14 decreases. When the proportion of the metal is 70 volume % or less, the insulating properties further improve.

The alloy may include impurities, excluding silicon and metal, as long as the surface resistivity and metallic luster of the decorative layer 14 can be maintained at a high level.

The thickness of the decorative layer 14 is preferably 10 nm to 500 nm, and more preferably 50 nm to 200 nm. When the thickness of the decorative layer 14 is 10 nm or more, the permeation of light becomes difficult, and a sufficient metallic luster is obtained. When the thickness of the decorative layer 14 is 500 nm or less, an increase in the conductivity is suppressed.

In addition, an increase in the internal stress is suppressed, and warpage, deformation, cracking, detachment, and the like are suppressed.

In a case in which the decorative layer 14 is thin, since light permeates the decorative layer such that the reflectance decreases, a dark metallic luster can be obtained. Therefore, the degree of metallic luster can be adjusted by changing the thickness of the decorative layer 14.

The thickness of the decorative layer 14 can be measured from a high-resolution microscopic photograph of a cross-section of the decorative layer 14.

The surface resistivity of the decorative layer 14 is preferably $10^3 \Omega$ or more, and more preferably $10^6 \Omega$ or more. In addition, the surface resistivity is preferably $10^{12} \Omega$ or less.

When the surface resistivity of the decorative layer 14 is $10^3 \Omega$ or more, a decrease in the variation amount of the electrostatic capacitance between an input body and the electrode 20 is further suppressed.

The surface reflectivity of the decorative layer 14 is measured using the 4 probe method described in JIS K7194.

The average surface roughness of the decorative layer 14 is preferably 0.05 μm or less. When the average surface roughness of the decorative layer 14 is 0.05 μm or less, scattered reflection is suppressed so that a sufficient metallic luster can be obtained. The lower limit of the average surface roughness of the decorative layer 14 is set to 0.1 nm which can be realized in a grinding process.

The average surface roughness of the decorative layer 14 is the arithmetic average roughness Ra of JIS B0601-2001. Specifically, the surface shape is measured using a surface roughness measuring device, and is extracted by the reference length in a direction of the average line, and the absolute values of the deviation from the average line of the extracted portions to the roughness curve are summed and averaged, thereby obtaining a value (arithmetic average roughness Ra).

The average surface roughness of the decorative layer 14 has an influence on the average surface roughness of the insulating layer 12. Therefore, the average surface roughness of the insulating layer 12 is preferably 0.01 μm to 0.5 μm, and more preferably 0.01 μm to 0.1 μm.

When the average surface roughness is 0.5 μm or less, since the decorative layer 14 follows the surface of the insulating layer 12 even when the decorative layer 14 is thin, a sufficient metallic luster, like a mirror surface, can be obtained.

The average surface roughness of the insulating layer 12 is the arithmetic roughness Ra regulated in JIS B0601-2001.

The decorative layer 14 is formed by the physical deposition of silicon or an alloy of silicon and a metal.

The physical deposition method is a method in which an evaporation material (silicon or an alloy thereof) is gasified in a vacuumed container, and the gasified evaporation material is accumulated on a substrate placed nearby, thereby forming a thin film, and is classified into an evaporation-based method and a sputtering-based method according to the difference in the gasification method of the evaporation material. Examples of the evaporation-based method include EB deposition, ion plating, pulse laser deposition, and the like; and examples of the sputtering-based method include RF (high frequency) sputtering, magnetron sputtering, opposite target-type magnetron sputtering, ECR sputtering, and the like.

In the EB deposition method, there is a tendency that the film is liable to become porous and the film strength becomes insufficient, but a substrate is only slightly damaged. According to ion plating, a film having a strong attachment force can be obtained, which is preferable. In DC magnetron sputtering, the growth rate of a film is fast; in opposite target-type magnetron sputtering, a thin film can be generated without causing plasma damage on the ground; and, in RF sputtering, a target (evaporation material) with a high resistance can be used, which is preferable.

(Protective Layer)

The protective layer 16 is a layer that protects the decorative layer 14, and needs to be transparent so as to keep the decoration function. Therefore, the visible light permeation rate of the protective layer 16 is preferably 80% to 100%, more preferably 85% to 100%, and still more preferably 90% to 100%.

Examples of the protective layer 16 include a layer formed by attaching the same film as the insulating layer 12; a coated film formed by coating a transparent paint on the surface of the decorative layer 14; and the like.

Before forming the protective layer 16, an adhesion promotion treatment (plasma treatment, primer treatment, or the like) may be carried out on the surface of the decorative layer 14.

In addition, a treatment using an inorganic substance (silica, titanate, silazane, or the like) or an inorganic-organic hybrid treatment may be carried out on the surface of the protective layer 16.

(Electrode)

The electrode 20 is a layer formed on the surface of the insulating layer 12 (or the substrate 30) using the following method.

(i) A method of patterning into a desired shape through the etching of a metal thin film (aluminum foil, copper foil, or the like) attached to the surface of the insulating layer 12 (or the substrate 30).

(ii) A method of patterning into a desired shape through screen printing using conductive paste or a conductive polymer on the surface of the insulating layer 12 (or the substrate 30).

The conductive paste is prepared by dispersing carbon particles or metal particles in a resin.

The shape of the electrode 20 is not particularly limited, but the electrode needs to be large so that a variation in the electrostatic capacitance caused by a proximate operation or a touch operation by an input body can be detected using the external control unit.

The electrode 20 is preferably in contact with the sheet member 10 so as to prevent the generation of a gap and the intrusion of air, water and the like, since a stabilized electrostatic capacitance can be obtained.

The wire lines (not shown) can be formed using the same method as for the electrode 20.

(Substrate)

The substrate 30 supports the sheet member 10 and the electrode 20, and is made of a sheet-shaped or plate-shaped compact having mechanical strength.

Another Embodiment

The member for an electrostatic capacitance-type sensor of the invention is not limited to the sensor of FIG. 1.

Figure 2:
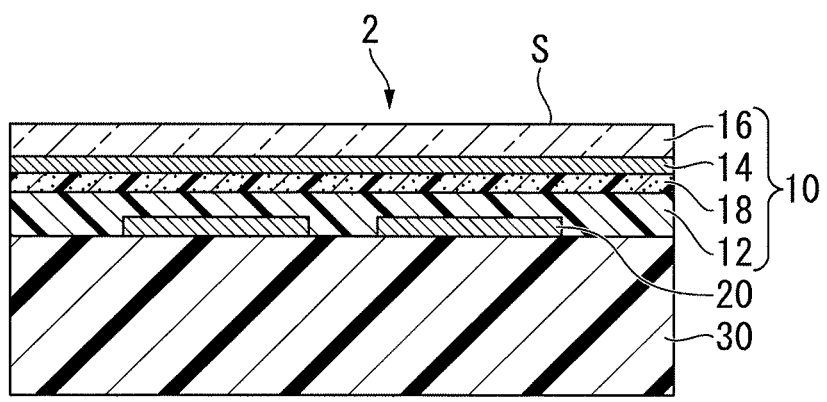
FIG. 2 is a cross-sectional view illustrating another example of the member for an electrostatic capacitance-type sensor of the invention.

FIG. 2 is a cross-sectional view illustrating another example of the member for an electrostatic capacitance-type sensor of the invention. The member for an electrostatic capacitance-type sensor 2 is provided with a reflection layer 18 on the electrode 20 side of the decorative layer 14. In a case in which the thickness of the decorative layer 14 is thin, since light permeates the decorative layer, when the reflection layer 18 is colored, the decorative layer 14 can be toned. In addition, when a white pigment (magnesium oxide, titanium oxide or the like) is added to the reflection layer 18, it is also possible to complement the reflectance of the decorative layer 14.

In addition, the number of the electrode 20 may be plural as shown in FIG. 2 according to the necessary number of input points.

The substrate 30 is not limited to a sheet shape or a plate shape, and may have an arbitrary shape. In addition, the substrate 30 may not be provided.

A printing layer for displaying letters, pictures and the like may be provided between the decorative layer 14 and the protective layer 16.

(Actions and Effects)

In the member for an electrostatic capacitance-type sensor of the invention described above, since the decorative layer having a metallic luster is a continuous film made of silicon or an alloy of silicon and a metal, the conductivity is low. Therefore, a decrease in the electrostatic capacitance caused between an input body and the electrode through a proximate operation or a touch operation by the input body is suppressed, and the variation in the electrostatic capacitance can be sufficiently detected using the external control unit connected to the electrode.

Since the material of the decorative layer is chemically stable compared to tin, aluminum or the like of the related art, the metallic luster is stable.

Since the material of the decorative layer is cheap compared to indium or the like of the related art and is stably supplied, the decorative layer can be stably produced at a low cost.

Since the decorative layer does not have a discontinuous island-like structure which is different from the related art, the conductivity does not vary during a manufacturing process. Therefore, it is not necessary to carry out function examination for all islands, which leads to favorable productivity.

<Electrostatic Capacitance-Type Sensor>

The electrostatic capacitance-type sensor of the invention includes the member for an electrostatic capacitance-type sensor of the invention and the control unit connected to the electrode of the member for an electrostatic capacitance-type sensor through the wire lines.

The control unit includes a detection circuit which applies a predetermined voltage to the electrode at a predetermined cycle as a detection signal, and detects a variation in the electrostatic capacitance between an input body and the electrode when a proximate operation or a touch operation by the input body is carried out on the operation surface as a change in the waveform of the detection signal.

According to the electrostatic capacitance-type sensor of the invention described above, since the sensor includes the member for an electrostatic capacitance-type sensor of the invention, a decrease in the detection accuracy of a proximate operation or a touch operation by an input body is suppressed, and the sensor has a metallic luster appearance which does not degrade with time.

<Input Apparatus>

The electrostatic capacitance-type sensor of the invention can be used as a sensor which detects a proximate operation or a touch operation by an input body, such as a finger, in an input apparatus (an operation panel or the like, in which buttons, switches, keys, pads and the like for operating home appliances, mobile phones, personal computers, automobiles and the like are disposed).

The control unit of the electrostatic capacitance-type sensor of the invention in an input apparatus includes an interface unit which sends information based on the detection result of the detection circuit (that is, information based on a proximate operation or a touch operation by an input body) to an electronic device and the like in addition to the detection circuit.

EXAMPLES

Hereinafter, examples will be described.

Example 1

Sputtering was conducted using a target of silicon (50 volume %) and aluminum (50 volume %) so as to form a homogenous decorative layer having a thickness of 80 nm, a reflectance of 60%, a surface resistivity of $1.2 \times 10^4 \Omega$ and an average surface roughness of 0.040 μm on a surface of a polyethylene terephthalate film having a thickness of 50 μm and an average surface roughness of 0.046 μm (manufactured by Kosaka Laboratory Ltd., SURFCORDER SE500). An electrode having a diameter of 30 mm and wire lines connected to the electrode was formed on the other surface of the film using a silver paste.

Subsequently, a transparent acryl urethane paint was coated on the surface of the decorative layer, heated, dried, and cured using ultraviolet rays so as to form a protective layer having a thickness of 30 μm, thereby producing a sheet member.

The sheet member was attached to a compact made of an ABS resin having a thickness of 10 mm, thereby manufacturing 30 members for an electrostatic capacitance-type sensor 1 as shown in FIG. 1. The decorative layer had a chromium-tone luster.

The electrode in the member for an electrostatic capacitance-type sensor was connected to an external control unit through the wire lines, the protective layer on the top of the electrode was touched by a finger, a variation in the amount of electrostatic capacitance before and after the touching was confirmed, and, consequently, it was confirmed that stabilized touch operations could be detected in all of the 30 obtained members for an electrostatic capacitance-type sensor irrespective of the location of the electrode.

Example 2

A white pigment containing titanium oxide was coated and cured on one surface of a polyethylene terephthalate film having a thickness of 25 μm and an average surface roughness of 0.046 μm so as to obtain a dried thickness of 10 μm, thereby forming a reflection layer.

Subsequently, the same target as in Example 1 was sputtered onto the surface of the reflection layer so as to form a homogenous decorative layer having a thickness of 50 nm, a reflectance of 58%, a surface resistivity of $2.4 \times 10^4 \Omega$ and an average surface roughness of 0.114 μm. An electrode having a diameter of 30 mm and wire lines connected to the electrode were formed on the other surface of the film using silver paste.

Subsequently, a transparent acryl film having a thickness of 25 μm was attached to the surface of the decorative layer as the protective layer, thereby producing a sheet member.

The sheet member was attached to a compact made of an ABS resin having a thickness of 10 mm, thereby manufacturing 30 members for an electrostatic capacitance-type sensor 2 as shown in FIG. 2. The decorative layer had a chromium-tone luster.

The electrode in the member for an electrostatic capacitance-type sensor was connected to the external control unit through the wire lines, the protective layer on the top of the electrode was touched by a finger, a variation in the electrostatic capacitance amount before and after the touching was confirmed, and, consequently, it was confirmed that stabilized touch operations could be detected in all of the 30 obtained members for an electrostatic capacitance-type sensor irrespective of the location of the electrode.

Comparative Example 1

Figure 3:
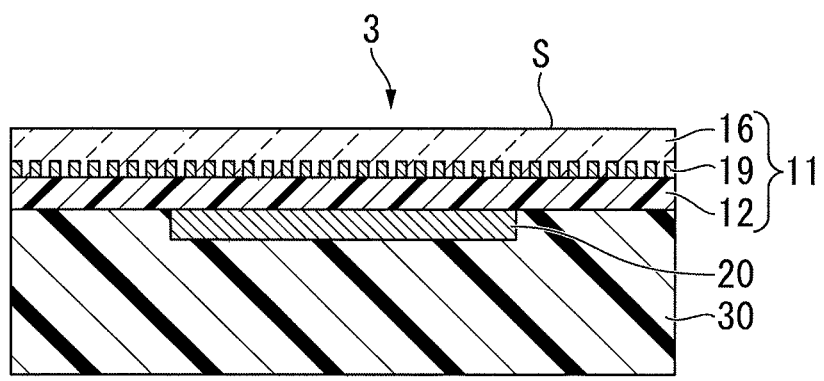
FIG. 3 is a cross-sectional view illustrating an example of a member for an electrostatic capacitance-type sensor of the related art.

Except that a discontinuous island-like structure having a thickness of 100 nm was formed through deposition as the decorative layer, 30 members for an electrostatic capacitance-type sensor 3 including the insulating layer 12, the decorative layer 19 made of a discontinuous island-like structure, and the sheet member 11 made of the protective layer 16 sequentially from the electrode 20 side as shown in FIG. 3 were manufactured in the same manner as in Example 1.

The electrode in the member for an electrostatic capacitance-type sensor was connected to the external control unit through the wire lines, the protective layer on the top of the electrode was touched by a finger, a variation in the electrostatic capacitance amount before and after the touching was confirmed, and, consequently, it was observed that touch operations could not be detected depending on the locations of the electrodes.

INDUSTRIAL APPLICABILITY

The member for an electrostatic capacitance-type sensor of the invention is useful as a member that can cause a variation in the electrostatic capacitance between an input body, such as a finger, and an electrode through a proximate operation or a touch operation by the input body in an electrostatic capacitance-type sensor provided in an input apparatus (an operation panel or the like, in which buttons, switches, keys, pads and the like for operating home appliances, mobile phones, personal computers, automobiles and the like are disposed).

REFERENCE SIGNS LIST

1 MEMBER FOR ELECTROSTATIC CAPACITANCE-TYPE SENSOR
2 MEMBER FOR ELECTROSTATIC CAPACITANCE-TYPE SENSOR
10 SHEET MEMBER
12 INSULATING LAYER
14 DECORATIVE LAYER
16 PROTECTIVE LAYER
18 REFLECTION LAYER
20 ELECTRODE
30 SUBSTRATE
S OPERATION SURFACE

The invention claimed is:

1. A member for an electrostatic capacitance sensor, the member comprising:
a sheet member having an operation surface configured to receive a proximate operation or a touch operation by an input body; and
an electrode which pinches the sheet member and is disposed on the sheet member on an opposite side from the operation surface,
wherein the sheet member includes a decorative layer having a metallic luster, and
the decorative layer is a continuous film made of an alloy of silicon and metal, and
the proportion of the metal is 0.1 volume % to 70 volume % with respect to the alloy.

2. The member for an electrostatic capacitance sensor according to claim 1,
wherein the sheet member further includes a protective layer provided on a surface of the decorative layer.

3. The member for an electrostatic capacitance sensor according to claim 1,
wherein the sheet member further includes a reflection layer provided on the electrode side of the decorative layer.

4. The member for an electrostatic capacitance sensor according to claim 1,
wherein the sheet member and the electrode are in contact with each other.

5. An electrostatic capacitance sensor, comprising:
the member for the electrostatic capacitance sensor according to claim 1; and
a control unit that detects a variation in an electrostatic capacitance between the input body and the electrode when a proximate operation or a touch operation by the input body is carried out on the operation surface.

6. The member for an electrostatic capacitance sensor according to claim 1, wherein the surface resistivity of the decorative layer is $10^3 \Omega$ or more.

7. The member for an electrostatic capacitance sensor according to claim 1, wherein the average surface roughness of the decorative layer is 0.1 nm to 0.05 μm.

8. The member for an electrostatic capacitance sensor according to claim 1, wherein the sheet member further includes an insulating layer having the average surface roughness of 0.01 to 0.5 μm.

9. The member for an electrostatic capacitance sensor according to claim 2, wherein the visible light permeation rate of the protective layer is 80% to 100%.

* * * * *